US006220879B1

(12) United States Patent
Ulrich

(10) Patent No.: US 6,220,879 B1
(45) Date of Patent: Apr. 24, 2001

(54) PLUG MODULE WITH ACTIVE-PASSIVE SWITCHING

(75) Inventor: Daniele Ulrich, Grüt (CH)

(73) Assignee: ELMA Electric AG, Wetzikon (CH)

( * ) Notice: Subject to any disclaimer, the term of this patent is extended or adjusted under 35 U.S.C. 154(b) by 0 days.

(21) Appl. No.: 09/470,049

(22) Filed: Dec. 22, 1999

(30) Foreign Application Priority Data

Dec. 28, 1998 (DE) ............................................ 298 23 122 U
Mar. 17, 1999 (EP) .................................................... 99810234

(51) Int. Cl.[7] .................................................. H01R 13/62
(52) U.S. Cl. ............................ 439/160; 439/341; 361/798
(58) Field of Search ..................................... 439/160, 157, 439/341; 361/798, 801, 752, 759, 754

(56) References Cited

U.S. PATENT DOCUMENTS

| 4,917,618 | * | 4/1990 | Behrens et al. | ........................ 439/160 |
| 5,577,922 | * | 11/1996 | Enomoto et al. | ..................... 439/160 |
| 5,629,836 | * | 5/1997 | Wright | ................................ 361/798 |
| 5,675,475 | * | 10/1997 | Mazura et al. | ........................ 439/157 |
| 5,940,276 | * | 8/1999 | Kurrer et al. | ......................... 361/754 |
| 5,959,843 | * | 9/1999 | Kurrer et al. | ......................... 439/157 |

FOREIGN PATENT DOCUMENTS

| 0 699 019 A1 | 2/1996 | (EP) | ................................ H05K/7/14 |
| WO 96/42187 | 12/1996 | (WO) | .............................. H05K/7/14 |
| WO 98/34449 | 8/1998 | (WO) | .............................. H05K/7/14 |

OTHER PUBLICATIONS

"Latches for Equipment Drawers", NTIS Tech Notes, US, US Department of Commerce, Springfield, VA, Sep. 1,. 1992, p. 671.

* cited by examiner

Primary Examiner—Tulsidas Patel
(74) Attorney, Agent, or Firm—Townsend and Townsend and Crew LLP

(57) ABSTRACT

A module carrier with a plug module (2) can be moved into and out of a rear final position (10) with an insertion and removal grip (5). A spring-actuated lock (12) at the front side (7), which secures the insertion and removal grip in the rear final position, actuates a switching element (11) for an active switching of the plug module after an effective locking position has been reached. A pressing down of the lock (12) effects a passive switching in the locked state before the insertion and removal grip (5) is unlocked after a further displacement distance of the lock and mechanically stores the unlocking in cooperation with lock (12).

14 Claims, 5 Drawing Sheets

PLUG MODULE WITH ACTIVE-PASSIVE SWITCHING

BACKGROUND OF THE INVENTION

The present invention relates to a module carrier with a plug module which is introducible by means of guides in a housing and which is provided with at least one insertion and removal grip in the form of a lever which is journalled on an axle at its front side in order to overcome thrust-in and draw-out forces at multiple plugs which are attached at the rear side through a bracing at a front-side housing profile.

A front system for a flat module with active-passive switching is shown in WO 96/42187 which samples an insertion position of the flat module via a switching element independently of whether a latching has actually occurred or not. An unintentional non-latching in of a lock as well as a displacement of the switching point in the push-in direction can lead to switching states which are in contradiction to the mechanical situation.

SUMMARY OF THE INVENTION

It is an object of the invention to create a reliable latching for module carriers with plug modules. This object is satisfied in that, for an insertion and removal grip, an additional spring-actuated lock is attached to the front side which compulsorily locks the lever in a rear final position of the plug module and which, after the unlocking of the lever, makes a locking of the lever possible only when the lever is rotated at least by an angle $\alpha \geq \epsilon$ in the moving-out direction and back again into the rear final position, with the angle $\epsilon$ representing an overlapping by means of which the lock blocks itself in the unlocked position at a guide surface of the lever, whereas when the lever is rotated by an angle $\alpha \geq \epsilon$ and back the lock is held by the guide surface in a further unlocked position.

This arrangement has the advantage that it monitors the effectiveness of the locking of the insertion and removal grip.

A further advantage consists in that the spatial arrangement of lever and lock is carried out so adeptly that the spatial and technical switching requirements of the norms

IEEE STANDARD 1101.10

HOT SWAP SPECIFICATION PICMG 2.1 R1.0

VME 64 EXTENSIONS STANDARD VITA 1.1-199X, DRAFT 2.0 can be fulfilled.

According to the invention, one advantage results in that the lock, after an effective locking position has been reached, actuates a switching element for an active switching of the plug module; and in that in a pressing down of the lock the latter effects a passive switching at the switching element before the lever is released by the lock.

The switching element is thereby actuated for the active switching only when a locking of the grip lever has taken place, and the electrically acting switching element is already passively switched when the locking releases the grip lever. A further advantage is present in an unintentional pressing down of the locking, since on the one hand a passive switching must already have taken place when the lock is held in the unlocked position and on the other hand a minimum rotation forwards and backwards of the grip lever must take place before a locking with subsequent activation of the switching element can take place again at all.

When the lock is pressed down the latter blocks itself out of the locked position in an unlocked position without the active influence of other elements, and with the rotation of the lever the latter blocks the lock in an unlocked position until it has again reached the rear final position with the plug module. The actual locking takes place compulsorily through a spring when the rear final position has been reached. This has the advantage that the actuation of the switching element always takes place through the spring, which is under the same bias force, and is not affected by the speed and the strikings during the moving in of the plug module. Because the lock is guided independently of the lever in a straight guide at the front side of the plug module, the lever need not be moved in order to come into an unlocking position. The lever cannot begin with rotation in the thrust out direction until an abutment at the lock, which is arranged counter to the direction of rotation of the lever, has been moved out.

A blow to the locked lever also causes no chatter at the switching element since the lock is supported in the switching direction of the switching element independently of the lever.

The advantages of the mechanical locking can also be exploited without an electrical switching element. Thus a second mirrored lever with a locking at the other end of the front side of a plug module can be provided in order to facilitate the levering in and out and to achieve merely a further locking of the plug module in the moved in state. In an arrangement of this kind an additional screw connection between the front plate and the housing profile can be dispensed with, so that only forwardly running centering pins engage at the housing profile in order to take up lateral forces.

Since an overlap angle $\epsilon$ between the lever and the lock sets in when the unlocked state is reached, by a minimum of which the lever must be rotated before a locked position can again be reached through a rotating back of the lever, it is advantageous when the angle $\phi$ for the flank change for thrusting out is greater than the overlap angle $\epsilon$. This causes the return from the unlocked state to the locked state to be possible without a movement taking place at the multiple plugs of the plug module which are attached at the rear side.

The lever and the lock are constructed in such a manner that they can be manufactured in each case in an injection molding process in an injection tool, with the essential function dimensions for the mutual engagement being tool-bound dimensions. The manufacturing tolerances are correspondingly small, which effects a great reliability for the functioning.

DESCRIPTION OF THE PREFERRED EMBODIMENTS

Figure 1:
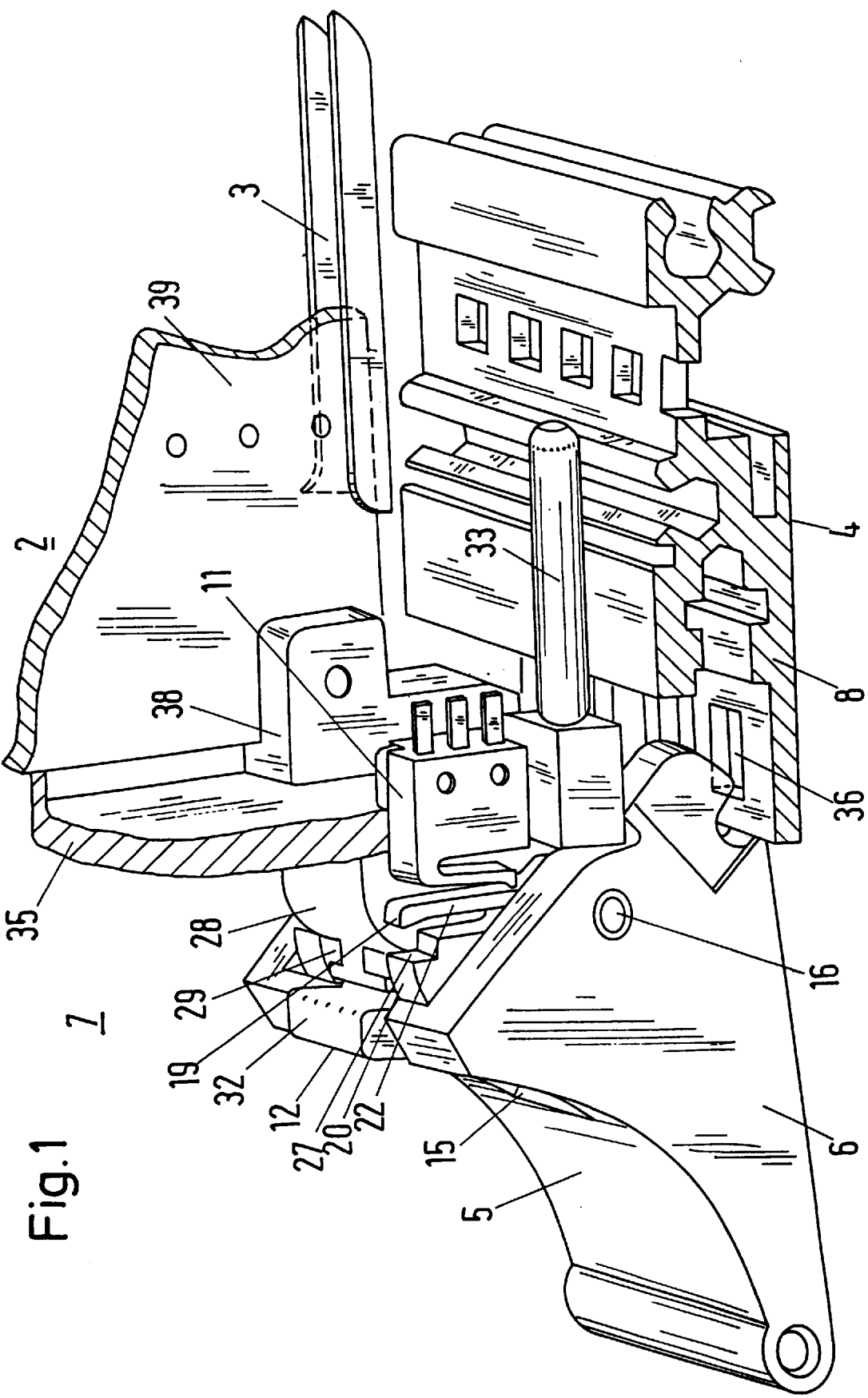
FIG. 1 shows a section at the lower front side of a plug module during the thrusting out of a module carrier out of the housing.

A module carrier with a plug module 2 which can be moved with an insertion and removal grip 5 into and out of a rear final position 10 is shown in the figures. An additional spring-actuated lock 12 at the front side 7, which secures the insertion and removal grip compulsorily in the rear final position, actuates a switching element 11 for an active switching of the plug module after an effective locking position has been reached. A pressing down of the lock 12 effects a passive switching in the locked state before the insertion and removal grip 5 is unlocked after a further displacement distance of the lock and mechanically stores the unlocking in cooperation with lock 12.

In FIG. 1 the plug module 2 is put together with a front plate 35 at its front side 7 as a printed plate 39 via securing elements 38. Likewise secured at the front plate 35 at the lower and upper ends is a socket 28, which forms a carrier body for the switching element 11 and for the lever 6 via an axle 16. Ahead of the axle 16 and parallel to the front plate 35 the socket 28 is formed to a T-shaped profile, which together with its grooves 29 forms a vertical longitudinal guide for the lock 12, which grips around the T-shaped profile. The insertion and removal grip 5 is designed as a lever 6 which is rotatably journalled with two lateral lugs via the axle 16 at the socket 28 and largely covers over the lock 12 together with the socket. At the insertion and removal grip 5 there is a cut-out 15, through which the lock 12 protrudes outwardly with a projection 32 for its actuation. At the lock 12 in the plane perpendicular to the axle 16, functional elements such as an engagement surface 20, an abutment 27 and a laterally formed on spring element with an engagement surface 19 are shown, which actuate the switching element 11 in cooperation with the lever 6. The plug module can be pushed in at its lower and upper sides into guides 3 at the housing 4 in order to produce a connection at its reverse side (not shown here) via multiple plugs. The switching element 11 is executed as a micro-switch with plug contacts in order to be able to connect it to the printed plate 39. The housing ends in the direction towards the front side 7 as a housing profile 8 with cut-outs 36 into which the lever 6 can engage in order to more easily overcome the clamping forces at the reverse-side multiple plugs through its gearing down.

Figure 2:
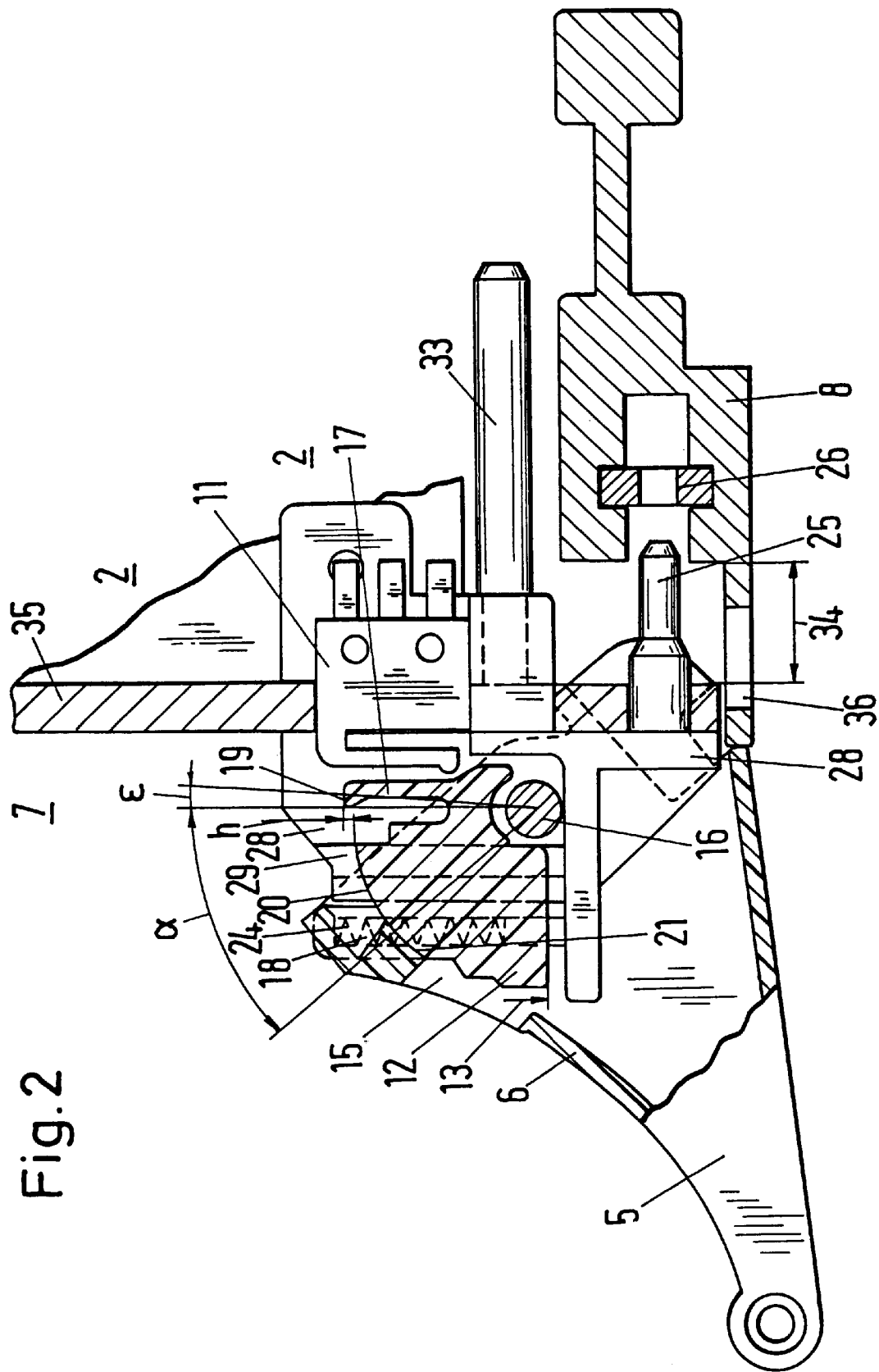
FIG. 2 shows a section through the arrangement in the moved out position in accordance with FIG. 1.
Figure 3:
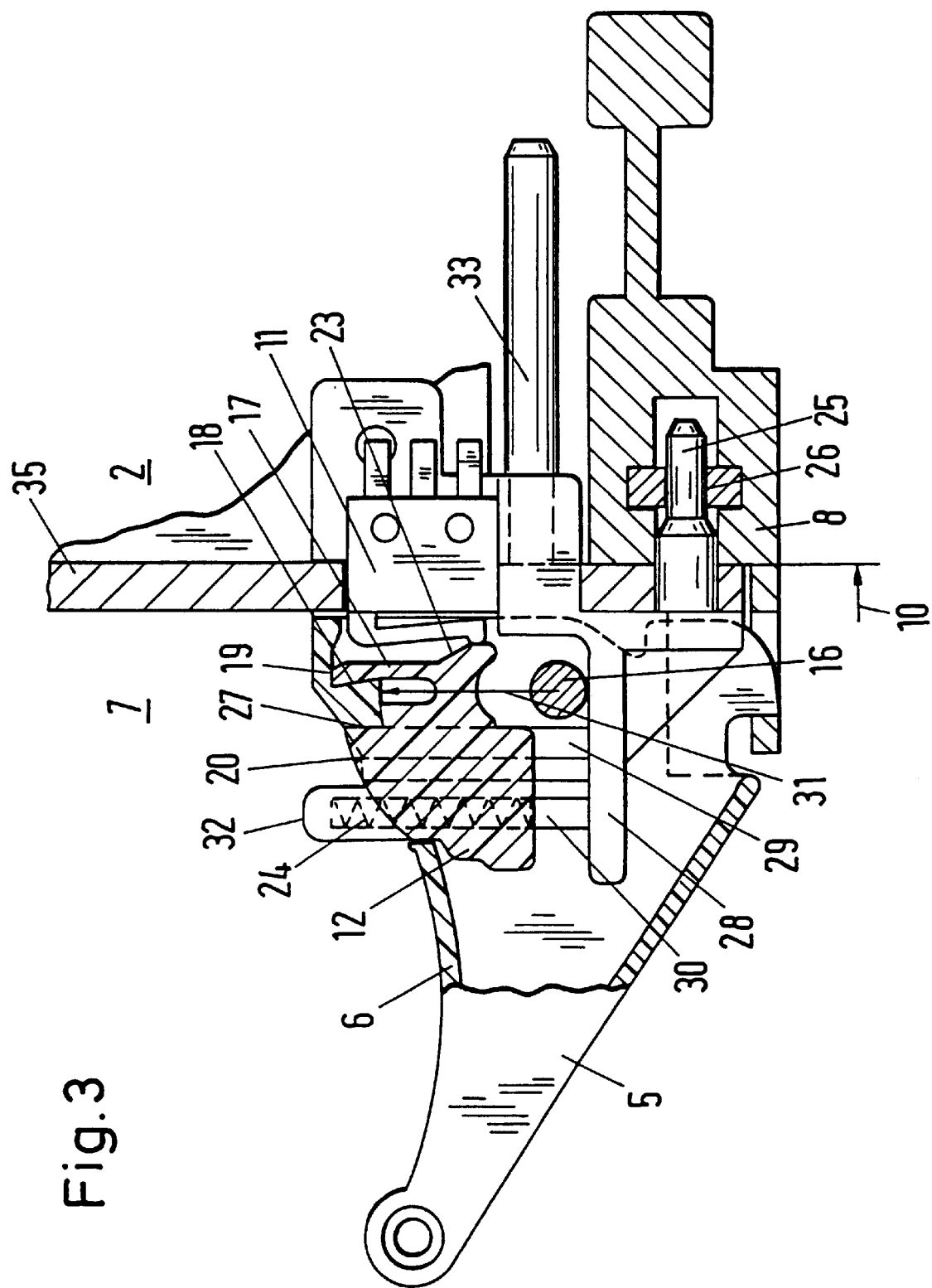
FIG. 3 shows the arrangement of FIG. 2 locked in the moved in position.
Figure 4:
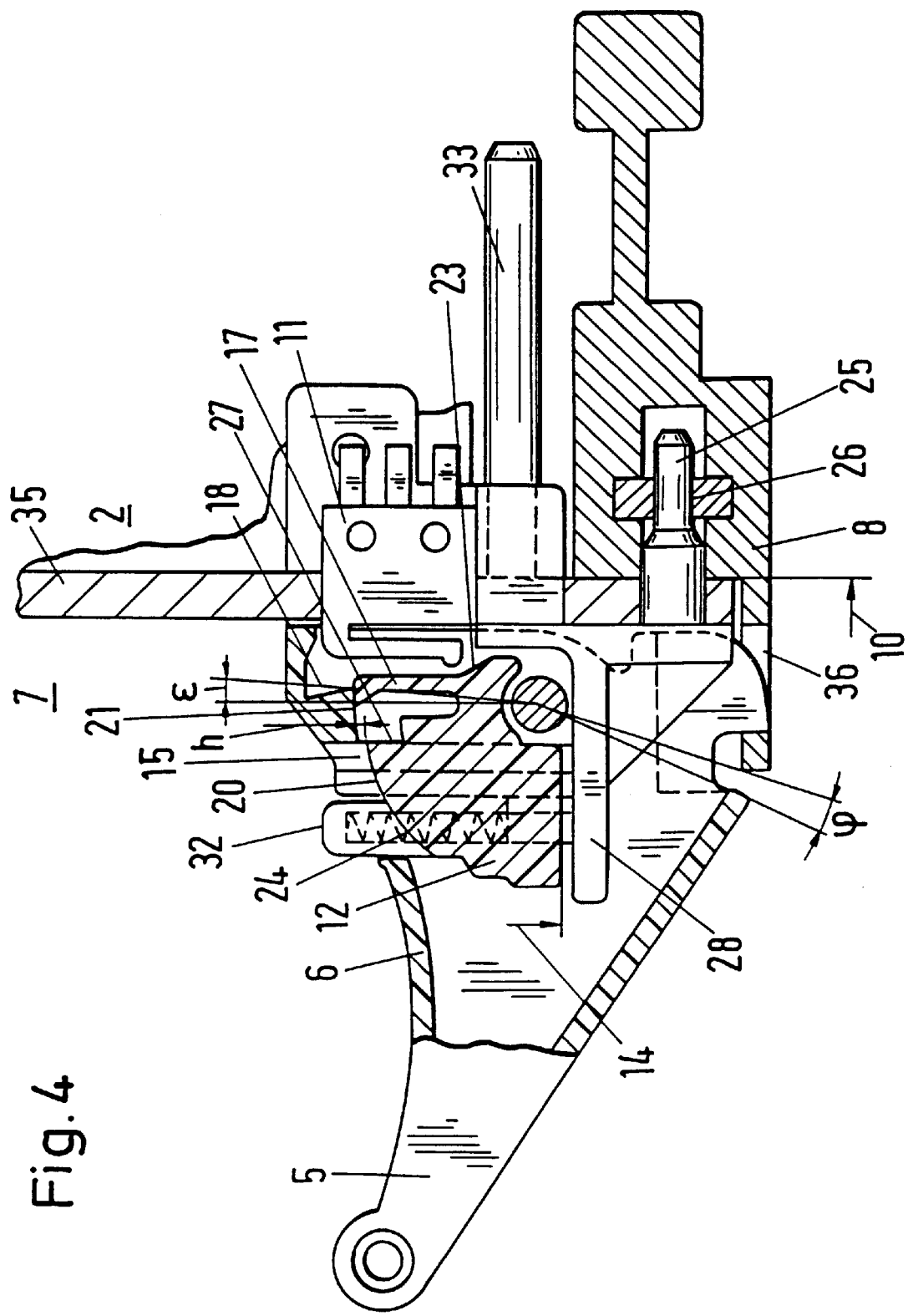
FIG. 4 shows the arrangement of FIG. 3 unlocked in the moved in position.

FIGS. 2 to 4 are provided with the same reference symbols and represent different switching situations, with the lock 12 and the lever 6 being sectioned in the previously mentioned plane for the functional elements. FIG. 2 represents the position during the lifting out of the plug module in which the rotation of the lever 6 by an angle α has caused a lifting out by a lifting out distance 34 having an amount of for example 6.5 mm, and for the continuation of the movement the plug module is drawn out at the levers 6 without rotation.

The plug module must be pushed in at the same rotational angular position α in order that the projecting noses of the lever 6 can dip into the cut-outs 36 at the housing profile 8. In this situation the lock 12 is pressed upwardly by a restoring spring 24 along the guide grooves 29 and lies with the circular engagement surface 20 in contact at a likewise circular guide surface 21 of the lever with radius 31. The vertical position of the lock 12 corresponds to an unlocked position 13 which remains unchanged in a rotation of the lever since both circular surfaces 20, 21 coincide at their center with the axis 12. In a rotating back of the lever 6 about the angle α an inclined shoulder 18 with an overlapping of a height h, which can for example amount to 1 mm, is brought into contact at a leaf spring 17. In this position the guide surface 21 still covers over parts of the engagement surface 20 and prevents the lock 12 from being thrust upwardly by the restoring spring 24.

Only after the further rotation by an angular amount ε is the lock 12 released and at the same time the leaf spring 17 is bent back by this amount. The restoring spring 24 is designed in such a manner that it reliably overcomes the friction of the lock 12 at the socket 28 and at the lever 6 as well as the switching force of a cam 23 against switching element 11 in order to arrive into the position corresponding to FIG. 3. An abutment 27 at the lock 12 prevents the lever 6 from rotating back in spite of the leaf spring, which is under a bias force. The movement sequence which is triggered by the restoring spring provides first for the lever 6 being locked, then subsequently the switching element being actuated at a safety distance of the cam 23 and for the possibility of the tip of the leaf spring 17 at the inclined shoulder 18 of the lever sliding back into its relaxed state by an angular amount ε when the lock 12 has completely moved in. This position, which is assumed in FIG. 3, is necessarily reached through the rotation of the lever 6 and corresponds to the final state in the moving in of the plug module.

The lifting out of the plug module takes place from this locked final state in that the lock 12 is first pressed down at the projection 32. In this the downwardly moving cam 23 departs from the micro-switch and triggers the passive switching of the plug module, whereas a rotational movement of the lever 6 is still blocked by the abutment 27 at the lock. During the downward movement of the lock 12 the leaf spring is subjected to a bias force about an angular amount ε on the inclined shoulder 18 of the lever, through which it moves resiliently back as soon as its tip is released by the inclined shoulder 18. Through the resilient moving back an overlapping between an engagement surface 19 and the guide surface 21 sets in; and the unlocked state of FIG. 4 arises, out of which the lever 6 can be rotated and, to the extent that the overlapping between the engagement surface 19 and the guide surface 21 decreases, builds up a new overlapping between the guide surface 21 and the engagement surface 20. As soon as the engagement surface 19 of the leaf spring has been departed from, the lock is thrust out of an unlocked position 14 by the height dimension "h" into the unlocked position 13 in which the circular engagement surface 20 and the guide surface 21 make contact. The further the guide surface 21 slides downwards on the engagement surface 20 with the rotation of the lever 6, the greater is the normal force between these two surfaces, with the spring force being constant, and thus also the frictional force, so that the lever 6, on reaching an angle α as in FIG. 2, is held in this angular position through the greatest frictional force. This has the advantage that the lever 6 does not fall downwardly even in a mirrored arrangement at the upper front side in spite of its inherent weight, but rather can be maintained in the position which is predetermined by the angle α, which is determined by the abutment of the lever 6 at the socket 28.

A further advantage consists in that the active or passive switching of the plug module is also outwardly visible through the locked or unlocked position of the lock.

It is evident that the mechanism of the locking shown here, which is outwardly displayed by the position of the projection 32, can also be used without the switching element 11 and in general outside the cited norms for a visually or tactually monitorable locking.

Figure 5:
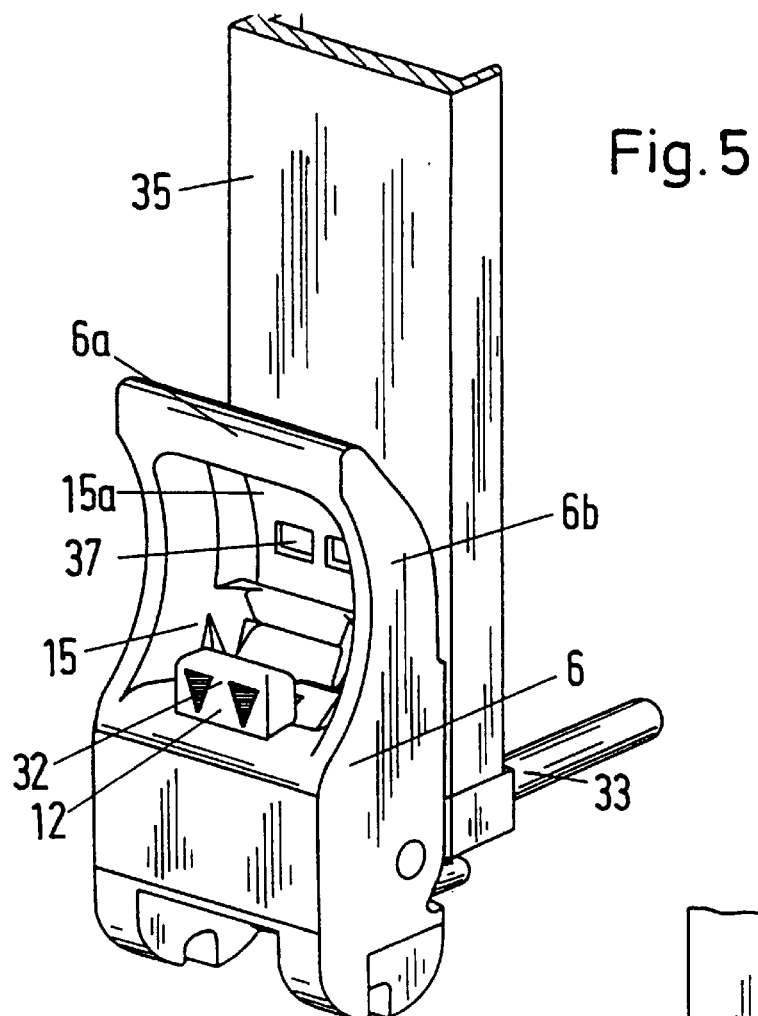
FIG. 5 shows a further embodiment of an insertion and removal grip, the lever arm of which is aligned parallel to the front plate in the rear final position of the plug module and has a window through which display elements are visible in the front plate.
Figure 6:
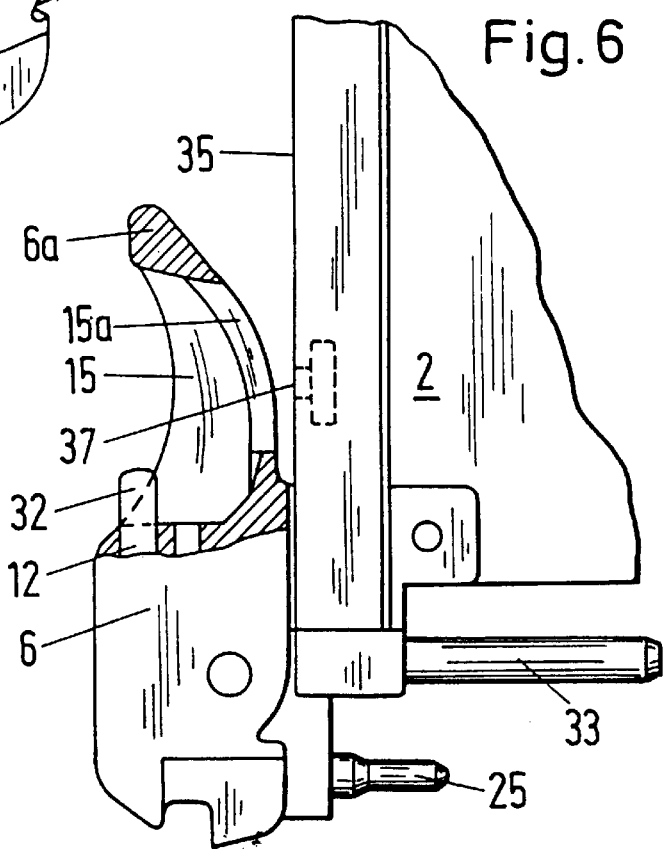
FIG. 6 is a side view of the embodiment of FIG. 5.

In a further embodiment as shown in FIG. 5 and FIG. 6 the lever 6 of the insertion and removal grip 5 is designed in such a manner that the lever 6 is aligned parallel to the front plate 35 when the rear final position of the plug module is reached. A cut-out 15, into which the lock 12 protrudes with its projection 32 for its actuation, is provided on the front side in this position. The cut-out 15 is dimensioned so large that the projection 32 can be pressed down for the unlocking with at least one finger knoll. This arrangement has the advantage that the lever 6 does not project far and that the lock 12 is mechanically protected by the lever 6, which stands above it in the shape of a shell.

A further advantage, which holds quite generally for insertion and removal grips which are aligned parallel to the front plate, consists in that a lever 6 of this kind, which necessarily covers over a part of the front plate 35, is provided with a window 15a or is manufactured of a transparent material in order to make display elements 37 lying above it visible in the front plate 35.

In the present exemplary embodiment of FIGS. 5 and 6 a window 15a is provided in the lever 6 so that the lever 6 actually has two side cheeks 6b and a transversal 6a. Light emitting diodes are visible on the front plate 35 through the window 15a as display elements 37 and can provide information on the status of the plug module 2. If a lever arm 6 of this kind is combined with a locking mechanism, such as is described in the example of FIGS. 1 to 4, then this also has the advantage that an additional optical signal for the undamaged moving out of the plug module can be made visible through the window 15a. The process is then supplemented in such a manner that through the pressing down of the lock 12 the passive switching is initiated and the lever for the levering out of the plug module is released, and that when the passive switching is achieved a corresponding signal becomes visible through the window which signals to the operating personnel when the passive switching is completed. This is advantageous when the passive switching requires a longer amount of time because for example certain switching states in the plug module 2 cannot be reached immediately. A further aid for this case lies in the design of the dimensions of the lever 6. The cut-out 15 is chosen such that it permits the actuation of the lock 12 with at least one finger, while two or more fingers find room on the transversal of the lever 6. An operator must actuate the lock 12 with at least one finger and can during this time place at most one or even no adjacent finger on the transversal 6a in a rather inconvenient placement. As soon as he now in a following movement places the unlocking finger and possibly others onto the transversal, in order to overcome the not slight contact forces during the levering out, the window 15a is released and the status display of the passive switching becomes visible. There is thus the possibility, generally and especially in the case of a delayed passive switching, of a monitoring of the status of the plug module 2 at the location at which the actuation for the separation for the rear-side contacts is to be carried out. A further possibility consists in making the cut-out 15 and the window 15a so high that the display 37 is visible over the top of the unlocking finger.

What is claimed is:

1. A module carrier comprising a plug module which is introducible by means of guides in a housing and which is provided with at least one insertion and removal grip in the form of a lever which is journalled on an axle at a front side of the module in order to overcome thrust-in and draw-out forces generated by multiple plugs attached to the module by bracing against a housing profile, a spring-actuated lock at the front side which locks the lever in a rear final position of the plug module and which, after an unlocking of the lever, permits a re-locking of the lever only when the lever is rotated through at least an angle $\alpha \geq \epsilon$ in a moving-out direction before being moved back again into the rear final position, the angle $\epsilon$ representing an overlapping by means of which the lock blocks itself in the unlocked position at a guide surface of the lever, and wherein, when the lever is rotated through the angle $\alpha \geq \epsilon$ and back, the lock is held by the guide surface in an unlocked position.

2. A module in accordance with claim 1 including a spring element which is secured at the lock and which, when the lock is pressed down, at an inclined shoulder of the lever is deflectable by the angle $\epsilon$ counter to the moving-out direction of the lever.

3. A module carrier in accordance with claim 2 wherein a leaf spring is provided as the spring element; and wherein the leaf spring and the lock each have engagement surfaces which can be brought into contact at the guide surface of the lever which is pivotal about the axle, with the engagement surface of the spring element being more distant from the axle than the engagement surface of the lock by a height h.

4. A module carrier in accordance with claim 1 wherein the lock is provided with a stationarily braced restoring spring which counters movement of the lock in a press-down direction.

5. A module carrier in accordance with claim 1 wherein the plug module has a further locking mechanism without a switching element for securing the plug module.

6. A module carrier in accordance with claim 5 including centering pins which project in a push-in direction at the front side of the plug module and align the plug module at the front side in suitable bores at a front side of the housing profile.

7. A module carrier in accordance with claim 1 wherein the angle $\epsilon$ is smaller than an angle $\phi$ through which the grip lever moves between the end of the thrusting in into the rear final position and the beginning of the thrusting out of the plug module in the opposite direction.

8. A module carrier in accordance with claim 1 wherein the lever and the lock are each comprise an injection molded part.

9. A module carrier in accordance with claim 1 wherein a space requirement for the lever and the lock lies within dimensions of the IEEE STANDARD 1101.10 allowed for the insertion and removal grip.

10. A module carrier in accordance with claim 1 wherein the lever arm is aligned parallel to the front side of the plug module in the rear final position of the plug module in order to minimize a stand off from the front side in normal operation.

11. A module carrier in accordance with claim 1 wherein the lock, after an effective locking position has been reached, actuates a switching element for an active switching of the plug module; and wherein movement of the lock in a pressing-down direction causes a passive switching of the switching element before the lever is released by the lock.

12. A module carrier in accordance with claim 11 wherein the lock has a cam for the actuation of the switching element which is displaceable transversely to the switching direction of the switching element.

13. A module carrier in accordance with claim 11 wherein the electrical switching element is an electrical microswitch.

14. A module carrier in accordance with claim 11 including a status display for the passive switching of the plug module, and wherein the lever has a window or is transparent for viewing the status display.

* * * * *